United States Patent
Nakamura

(10) Patent No.: US 7,576,033 B2
(45) Date of Patent: Aug. 18, 2009

(54) PROCESS FOR PRODUCING $BI_{12}MO_{20}$ PARTICLES AND PHOTO-CONDUCTOR LAYER FOR RADIATION IMAGING PANELS

(75) Inventor: Shigeru Nakamura, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 432 days.

(21) Appl. No.: 11/370,997

(22) Filed: Mar. 9, 2006

(65) Prior Publication Data

US 2006/0204423 A1    Sep. 14, 2006

(30) Foreign Application Priority Data

Mar. 9, 2005  (JP)  ............................ 2005/065128

(51) Int. Cl.
| | |
|---|---|
| B01J 23/18 | (2006.01) |
| B01J 23/14 | (2006.01) |
| C01B 33/20 | (2006.01) |
| C01G 29/00 | (2006.01) |
| C01G 19/02 | (2006.01) |
| C01G 17/00 | (2006.01) |

(52) U.S. Cl. ..................... 502/353; 502/349; 423/326; 423/594.7; 423/618

(58) Field of Classification Search ................. 423/618, 423/326, 594.7; 502/349, 353
See application file for complete search history.

(56) References Cited

U.S. PATENT DOCUMENTS 6,773,690 B1 * 8/2004 Noweck et al. ............. 423/625

FOREIGN PATENT DOCUMENTS

| JP | 56005549 A | * | 1/1981 |
| JP | 58151319 A | * | 9/1983 |
| RU | 1773870 A1 | * | 11/1992 |

OTHER PUBLICATIONS

Microtec Nition, "Homogenizer Series: Physcotron." http://nition.com/product/physco_principle.htm and http://nition.com/en/products/physcotron.htm. Downloaded from website on Apr. 7, 2009.*

Matjaz Valant, et al., "Processing and Dielectric Properties of Sillenite Compounds $Bi_{12}MO_{20-\delta}$(M=Si, Ge, Ti, Pb, Mn, $B_{frax;1;2}P_{frax;1;2}$)", J. Am. Ceram. Soc., 2001, pp. 2900-2904, vol. 84, No. 12.

H.S. Horowitz, et al., "Solution Synthesis and Characterization of Sillenite Phases, $Bi_{24}M_2O_{40}$(M=Si, Ge, V, As, P)", Solid State Ionics, 1989, pp. 678-690, 32/33.

* cited by examiner

Primary Examiner—Timothy C Vanoy
Assistant Examiner—Daniel Berns
(74) Attorney, Agent, or Firm—Sughrue Mion, PLLC

(57) ABSTRACT

An alkaline solution of an alkali-soluble compound, which is selected from the group consisting of an alkali-soluble silicon compound and an alkali-soluble germanium compound, is prepared. Also, a water-soluble bismuth compound solution is prepared. The alkaline solution and the water-soluble bismuth compound solution are subjected to mixing processing with agitation at a temperature of at least 80° C. by use of a shearing type agitator and are thereby allowed to react with each other. Thus $Bi_{12}MO_{20}$ particles, in which M represents an element selected from the group consisting of Si and Ge, are produced. The produced $Bi_{12}MO_{20}$ particles have small particle diameters and uniform composition.

17 Claims, 6 Drawing Sheets

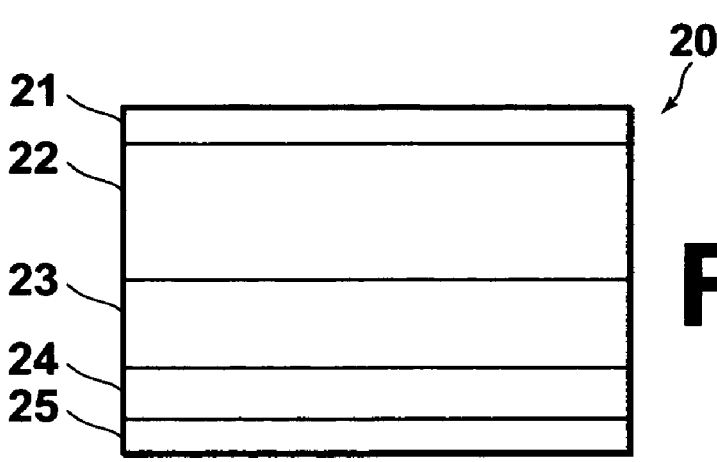
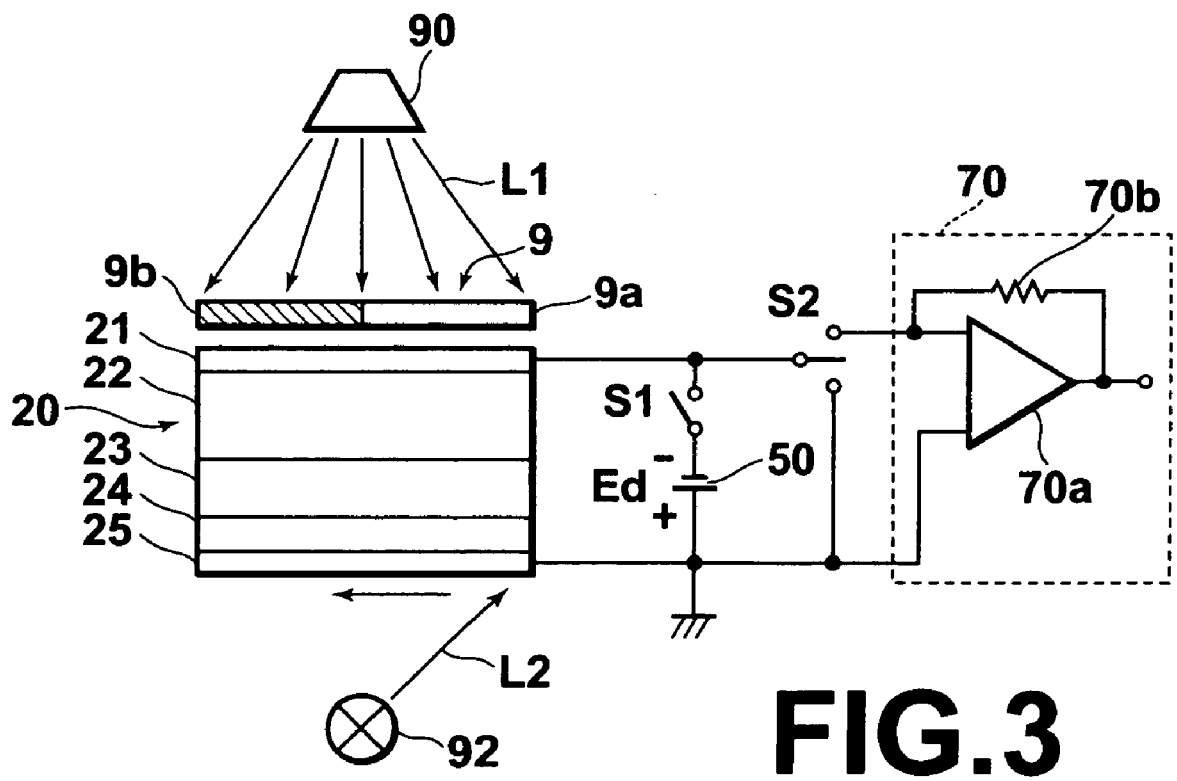

US 7,576,033 B2

PROCESS FOR PRODUCING $Bi_{12}MO_{20}$ PARTICLES AND PHOTO-CONDUCTOR LAYER FOR RADIATION IMAGING PANELS

BACKGROUND OF THE INVENTION

1. Field of the Invention

This invention relates to a process for producing $Bi_{12}MO_{20}$ particles. This invention also relates to a photo-conductor layer for constituting a radiation imaging panel, which photo-conductor layer utilizes the $Bi_{12}MO_{20}$ particles.

2. Description of the Related Art

A material represented by a chemical formula $Bi_{12}MO_{20}$, in which M represents Si or Ge, has photo-conductivity and dielectric characteristics. Therefore, it has heretofore been studied to utilize the $Bi_{12}MO_{20}$ material for constituting electro-photographic materials, X-ray detecting materials, ceramic capacitors, and the like. In cases where the $Bi_{12}MO_{20}$ material is to be utilized for constituting the electro-photographic materials, the x-ray detecting materials, the ceramic capacitors, and the like, $Bi_{12}MO_{20}$ particles have heretofore been produced by use of a solid phase technique, in which single oxides of the constituent elements are mixed together and fired. The solid phase technique for producing the $Bi_{12}MO_{20}$ particles is described in, for example, a paper by M. Valant and D. Suvorov, "Processing and Dielectric Properties of Sillenite Compounds $Bi_{12}MO_{20-\delta}$(M=Si, Ge, Ti, Pb, Mn, $B_{1/2}P_{1/2}$)", J. Am. Ceram. Soc., 84 (12), pp. 2900-2904, 2001.

However, the particles obtained with the solid phase technique often have the drawbacks in that the composition is not uniform, and in that the particle shapes and the particle sizes are not uniform. Therefore, with the particles obtained with the solid phase technique, it is not always possible to form a uniform molded material having a high density or a ceramic material having good quality. Also, in order for the solid phase technique to be performed, it is necessary to perform grinding and mixing steps. In the grinding and mixing steps, impurities originating from vessels utilized for the grinding and mixing steps inevitably mix into the particles. Therefore, the problems are encountered in that a finished product having sufficiently good performance is not capable of being obtained.

Besides the solid phase technique described above, a process for producing the $Bi_{12}MO_{20}$ material with a liquid phase technique has heretofore been known. As for the liquid phase technique, a technique for synthesizing $Bi_{12}MO_{20}$ is described in, for example, a paper by H. S. Horowitz et al., "Solution Synthesis and Characterization of Sillenite Phases, $Bi_{24}M_2O_{40}$(M=Si, Ge, V, As, P)", Solid State Ionics, 32/33, pp. 678-690, 1989. The technique for synthesizing $Bi_{12}MO_{20}$ described in the aforesaid paper comprises the steps of dissolving $Bi(NO_3)_3$ and an element source, which is selected from the group consisting of $Na_2O\cdot xSiO_2$ acting as an Si source and $GeO_2$ acting as a Ge source, in an acid, causing precipitation to occur by the addition of an alkali metal hydroxide, adjusting a pH value, and setting the temperature at an appropriate temperature, whereby $Bi_{12}MO_{20}$ is synthesized.

However, with the technique for synthesizing $Bi_{12}MO_{20}$ described in, for example, the paper by H. S. Horowitz et al., "Solution Synthesis and Characterization of Sillenite Phases, $Bi_{24}M_2O_{40}$(M=Si, Ge, V, As, P)", Solid State Ionics, 32/33, pp. 678-690, 1989, the produced $Bi_{12}MO_{20}$ particles have particle diameters of as large as approximately 10 µm. With the $Bi_{12}MO_{20}$ particles having the large particle diameters, the problems are encountered in that a dense molded material or a ceramic material having a high density is not capable of being formed. For example, the problems are encountered in that a photo-conductor layer produced by use of the $Bi_{12}MO_{20}$ particles having the large particle diameters has a low packing density and therefore has only a small effect of collecting generated electric charges.

SUMMARY OF THE INVENTION

The primary object of the present invention is to provide a process for producing $Bi_{12}MO_{20}$ particles, wherein $Bi_{12}MO_{20}$ particles having small particle diameters are capable of being obtained with a novel liquid phase technique.

Another object of the present invention is to provide a photo-conductor layer for constituting a radiation imaging panel, which photo-conductor layer utilizes the $Bi_{12}MO_{20}$ particles having been obtained with the process for producing $Bi_{12}MO_{20}$ particles.

The present invention provides a process for producing $Bi_{12}MO_{20}$ particles, in which M represents an element selected from the group consisting of Si and Ge, the process comprising the steps of:

i) preparing an alkaline solution of an alkali-soluble compound, which is selected from the group consisting of an alkali-soluble silicon compound and an alkali-soluble germanium compound, ii) preparing a water-soluble bismuth compound solution, and iii) subjecting the alkaline solution and the water-soluble bismuth compound solution to mixing processing with agitation at a temperature of at least 80° C. by use of a shearing type agitator, whereby the alkaline solution and the water-soluble bismuth compound solution are allowed to react with each other.

The process for producing $Bi_{12}MO_{20}$ particles in accordance with the present invention should preferably be modified such that a circumferential speed of an agitating blade of the shearing type agitator is at least 3 m/sec.

Also, the process for producing $Bi_{12}MO_{20}$ particles in accordance with the present invention should preferably be modified such that the mixing processing with agitation is performed while each of the alkaline solution and the water-soluble bismuth compound solution is being added at a certain feed rate to an alkaline mother liquor having been heated to a temperature of at least 80° C.

In such cases, the process for producing $Bi_{12}MO_{20}$ particles in accordance with the present invention should more preferably be modified such that the alkaline mother liquor contains at least one kind of compound selected from the group consisting of LiOH, NaOH, KOH, RbOH, and $NR_4OH$, in which R represents an alkyl group selected from the group consisting of alkyl groups having one to three carbon atoms.

Further, the process for producing $Bi_{12}MO_{20}$ particles in accordance with the present invention should preferably be modified such that the water-soluble bismuth compound contained in the water-soluble bismuth compound solution is at least one kind of compound selected from the group consisting of bismuth nitrate, bismuth trichloride, and bismuth tribromide.

Furthermore, the process for producing $Bi_{12}MO_{20}$ particles in accordance with the present invention should preferably be modified such that the alkali-soluble silicon compound is selected from the group consisting of an alkali metal silicate and a quaternary ammonium silicate.

Also, the process for producing $Bi_{12}MO_{20}$ particles in accordance with the present invention should preferably be modified such that the alkali-soluble germanium compound is selected from the group consisting of an alkali metal germanate and a quaternary ammonium germanate.

The alkaline solution of the alkali-soluble silicon compound should preferably contain the alkali-soluble silicon compound, which is selected from the group consisting of the alkali metal silicate and the quaternary ammonium silicate, and an amount of an alkali, which amount is sufficient for neutralizing the bismuth salt to be mixed together. In such cases, the alkali, which should preferably be contained in the alkaline solution of the alkali-soluble silicon compound, may be selected arbitrarily from the same group of alkalis as that described above with respect to the alkaline mother liquor.

Also, the alkaline solution of the alkali-soluble germanium compound should preferably contain the alkali-soluble germanium compound, which is selected from the group consisting of the alkali metal germanate and the quaternary ammonium germanate, and an amount of an alkali, which amount is sufficient for neutralizing the bismuth salt to be mixed together. In such cases, the alkali, which should preferably be contained in the alkaline solution of the alkali-soluble germanium compound, may be selected arbitrarily from the same group of alkalis as that described above with respect to the alkaline mother liquor.

The present invention also provides a photo-conductor layer for constituting a radiation imaging panel, which photo-conductor layer is capable of recording radiation image information as an electrostatic latent image, wherein the photo-conductor layer is produced by use of $Bi_{12}MO_{20}$ particles, in which M represents an element selected from the group consisting of Si and Ge, the $Bi_{12}MO_{20}$ particles having been obtained with a process comprising the steps of:

i) preparing an alkaline solution of an alkali-soluble compound, which is selected from the group consisting of an alkali-soluble silicon compound and an alkali-soluble germanium compound, ii) preparing a water-soluble bismuth compound solution, and iii) subjecting the alkaline solution and the water-soluble bismuth compound solution to mixing processing with agitation at a temperature of at least 80° C. by use of a shearing type agitator, whereby the alkaline solution and the water-soluble bismuth compound solution are allowed to react with each other.

With the process for producing $Bi_{12}MO_{20}$ particles in accordance with the present invention, the $Bi_{12}MO_{20}$ particles, in which M represents an element selected from the group consisting of Si and Ge, are obtained with the process comprising the steps of: (i) preparing the alkaline solution of the alkali-soluble compound, which is selected from the group consisting of the alkali-soluble silicon compound and the alkali-soluble germanium compound, (ii) preparing the water-soluble bismuth compound solution, and (iii) subjecting the alkaline solution and the water-soluble bismuth compound solution to the mixing processing with agitation at a temperature of at least 80° C. by use of the shearing type agitator, whereby the alkaline solution and the water-soluble bismuth compound solution are allowed to react with each other. Therefore, it is possible to obtain the $Bi_{12}MO_{20}$ particle shavings having an average particle diameter ranging from 0.5 µm to 2 µm. With the process for producing $Bi_{12}MO_{20}$ particles in accordance with the present invention, it is thus possible to obtain the $Bi_{12}MO_{20}$ particles having particle sizes markedly smaller than the particles sizes of the particles obtained with the conventional liquid phase technique. Also, with the process for producing $Bi_{12}MO_{20}$ particles in accordance with the present invention, there is no risk of the problems occurring in that impurities originating from the vessels utilized for the grinding and mixing steps mix into the particles during the grinding and mixing steps as in the cases of the solid phase technique. Accordingly, the $Bi_{12}MO_{20}$ particles having uniform composition are capable of being obtained.

The photo-conductor layer for constituting a radiation imaging panel in accordance with the present invention is constituted of the $Bi_{12}MO_{20}$ particles having the uniform composition and the small particle sizes. Therefore, with the photo-conductor layer in accordance with the present invention, the effect of collecting the formed electric charges is capable of being enhanced, and electric noise is capable of being suppressed. As a result, graininess characteristics of the obtained image are capable of being enhanced, and the sensitivity of the photo-conductor layer is capable of being enhanced.

The present invention will hereinbelow be described in further detail with reference to the accompanying drawings.

BRIEF DESCRIPTION OF THE DRAWINGS

FIG. 2 is a sectional view showing an example of a radiation imaging panel provided with a photo-conductor layer, which is produced by use of the $Bi_{12}MO_{20}$ particles having been produced with the process for producing $Bi_{12}MO_{20}$ particles in accordance with the present invention, FIG. 3 is a schematic view showing a recording and read-out system, in which the radiation imaging panel of FIG. 2 is employed.

DETAILED DESCRIPTION OF THE INVENTION

Figure 1:
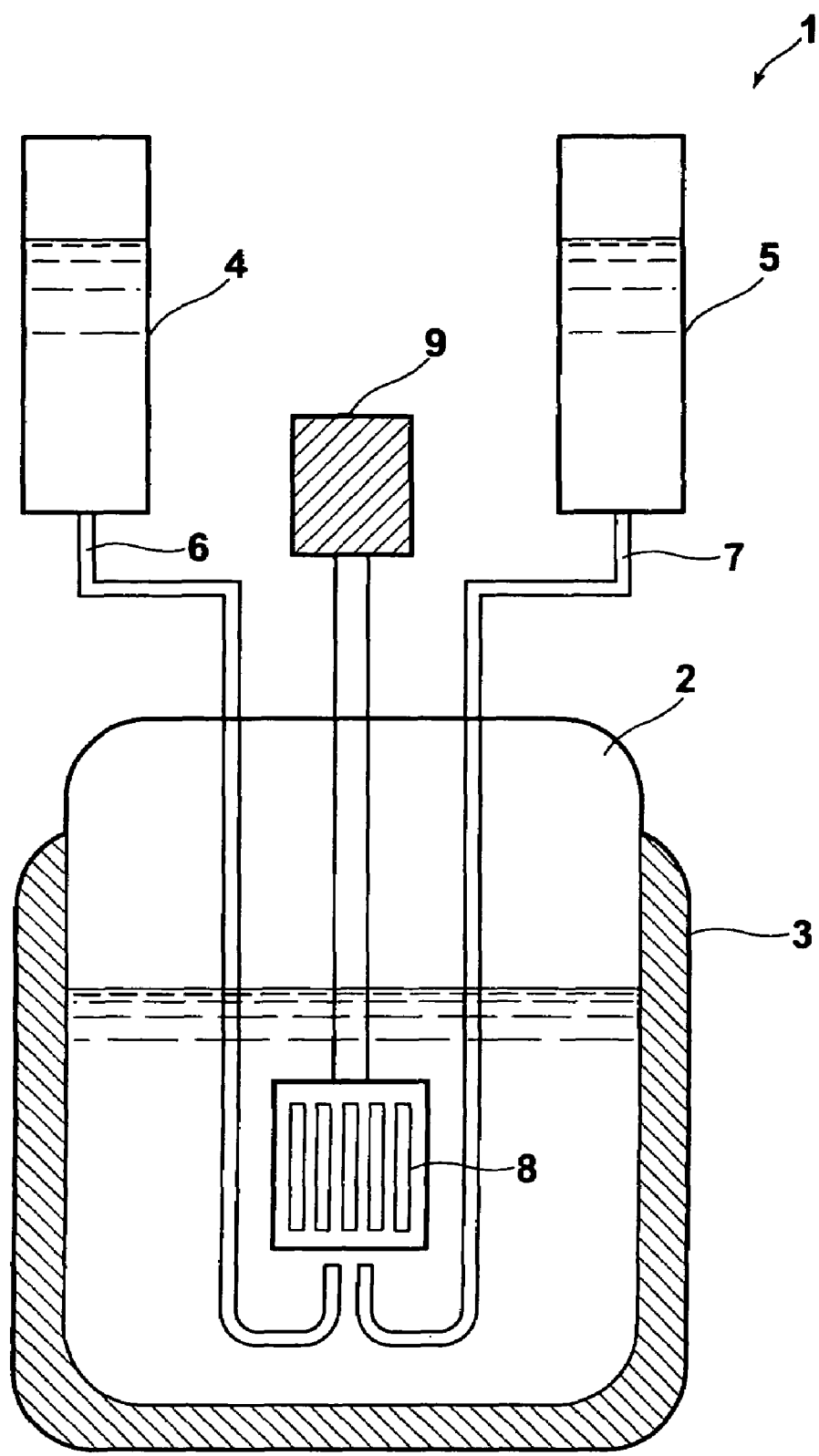
FIG. 1 is a schematic view showing an example of a production apparatus provided with a shearing type agitator, which production apparatus is capable of being utilized for carrying out an embodiment of the process for producing $Bi_{12}MO_{20}$ particles in accordance with the present invention.

With the process for producing $Bi_{12}MO_{20}$ particles in accordance with the present invention, the $Bi_{12}MO_{20}$ particles, in which M represents an element selected from the group consisting of Si and Ge, are obtained with the process comprising the steps of: (i) preparing the alkaline solution of the alkali-soluble compound, which is selected from the group consisting of the alkali-soluble silicon compound and the alkali-soluble germanium compound, (ii) preparing the water-soluble bismuth compound solution, and (iii) subjecting the alkaline solution and the water-soluble bismuth compound solution to the mixing processing with agitation at a temperature of at least 80° C. by use of the shearing type agitator, whereby the alkaline solution and the water-soluble bismuth compound solution are allowed to react with each other.

The shearing type agitator is provided with a rotating blade and a stationary ring (i.e., a stator). With the shearing type agitator, a liquid atomizing effect is enhanced by the utilization of a large shearing effect and impact force, which occur at fine spaces between the rotating blade and the stationary ring. By way of example, the shearing type agitator may be an agitator provided with a toothed disk-shaped impeller for high-speed rotation, the impeller being constituted of an agitating blade having an outside peripheral region taking on the form of saw-like blades, which are alternately bent upwardly and downwardly. Alternatively, the shearing type agitator may be a high-speed rotating shearing type agitator comprising a combination of an agitating blade and a stationary ring, which acts as a baffle plate for preventing excessive cavitation from occurring in the vicinity of the outside periphery of the agitating blade. As another alternative, the shearing type agitator may be a cell crusher (i.e., a homogenizer) provided with a shaft, which has an end part (i.e., a generator) constituted of a stationary outside blade and a rotating inside blade. With the cell crusher, when the inside blade is rotated quickly in a liquid, the liquid within the generator is jetted vigorously by centrifugal force and in radial directions from windows formed in the outside blade, and at the same time the liquid enters into the generator. Strong convection thus occurs in the entire area of the vessel, and fine crushing and homogenization are performed with the effect of an ultrasonic wave, a radio-frequency wave, or the like.

The circumferential speed of the agitating blade of the shearing type agitator should preferably be at least 3 m/sec. The term "circumferential speed" as used herein means the outside periphery speed of the agitating blade.

The mixing processing with agitation should preferably be performed while each of the alkaline solution and the water-soluble bismuth compound solution is being added at a certain feed rate to the alkaline mother liquor having been heated to a temperature of at least 80° C. In cases where the mixing processing with agitation is performed in the manner described above, the $Bi_{12}MO_{20}$ particles having smaller particle diameters and more uniform composition are capable of being obtained. The alkaline mother liquor may contain an alkali-soluble silicon compound, which acts as a silicon source, or an alkali-soluble germanium compound, which acts as a germanium source.

The water-soluble bismuth compound contained in the water-soluble bismuth compound solution should preferably be at least one kind of compound selected from the group consisting of bismuth nitrate, bismuth trichloride, and bismuth tribromide. The water-soluble bismuth compound may be a mixture of at least two compounds selected from the group consisting of bismuth nitrate, bismuth trichloride, and bismuth tribromide.

The alkali-soluble silicon compound should preferably be selected from the group consisting of the alkali metal silicate and the quaternary ammonium silicate. Also, the alkali-soluble germanium compound should preferably be selected from the group consisting of the alkali metal germanate and the quaternary ammonium germanate.

The alkaline solution of the alkali-soluble silicon compound may be prepared with the processing, wherein the alkali-soluble silicon compound is dissolved in at least one kind of compound selected from the same group of compounds as that described above with respect to the alkaline mother liquor, i.e. at least one kind of compound selected from the group consisting of LiOH, NaOH, KOH, RbOH, and $NR_4OH$, in which R represents an alkyl group selected from the group consisting of alkyl groups having one to three carbon atoms.

Also, the alkaline solution of the alkali-soluble germanium compound may be prepared with the processing, wherein the alkali-soluble germanium compound is dissolved in at least one kind of compound selected from the same group of compounds as that described above with respect to the alkaline mother liquor, i.e. at least one kind of compound selected from the group consisting of LiOH, NaOH, KOH, RbOH, and $NR_4OH$, in which R represents an alkyl group selected from the group consisting of alkyl groups having one to three carbon atoms.

FIG. 1 is a schematic view showing an example of a production apparatus provided with a shearing type agitator, which production apparatus is capable of being utilized for carrying out an embodiment of the process for producing $Bi_{12}MO_{20}$ particles in accordance with the present invention. With reference to FIG. 1, a production apparatus 1 for producing the $Bi_{12}MO_{20}$ particles comprises a reaction tank 2, in which the alkaline solution and the water-soluble bismuth compound solution are subjected to the mixing processing with agitation and thereby allowed to react with each other. The production apparatus 1 also comprises a jacket 3 for heating the reaction tank 2 and keeping the temperature of the reaction tank 2. The production apparatus 1 further comprises a solution tank 4, into which the alkaline solution is introduced. The production apparatus 1 still further comprises a solution tank 5, into which the water-soluble bismuth compound solution is introduced. The production apparatus 1 also comprises a liquid feeding flow path 6, through which the alkaline solution is to be sent from the solution tank 4 into the reaction tank 2. The production apparatus 1 further comprises a liquid feeding flow path 7, through which the water-soluble bismuth compound solution is to be sent from the solution tank 5 into the reaction tank 2. The production apparatus 1 still further comprises a shearing type agitator 8 for agitating the solution mixture in the reaction tank 2. The production apparatus 1 also comprises a motor 9 for actuating the shearing type agitator 8. As illustrated in FIG. 1, liquid flow outlets of the liquid feeding flow path 6 and the liquid feeding flow path 7, which liquid flow outlets are located on the side of the reaction tank 2, should preferably be located in the vicinity of the shearing type agitator 8. In such cases, the alkaline solution and the water-soluble bismuth compound solution are capable of being caused to react with each other immediately when the alkaline solution and the water-soluble bismuth compound solution come into contact with each other. Therefore, in such cases, the $Bi_{12}MO_{20}$ particles having smaller particle diameters and more uniform composition are capable of being obtained.

The $Bi_{12}MO_{20}$ particles may be produced by use of the production apparatus 1 in the manner described below. Specifically, the alkaline mother liquor is introduced into the reaction tank 2. Also, the alkaline mother liquor having been introduced into the reaction tank 2 is heated by the jacket 3 to a temperature of at least 80° C. Further, the alkaline solution is prepared in the solution tank 4, and the water-soluble bismuth compound solution is prepared in the solution tank 5. Furthermore, the motor 9 is actuated, and the alkaline mother liquor is agitated by the shearing type agitator 8. In this state, the alkaline solution is sent through the liquid feeding flow path 6 into the reaction tank 2, and the water-soluble bismuth compound solution is sent through the liquid feeding flow path 7 into the reaction tank 2. In such cases, the alkaline solution and the water-soluble bismuth compound solution are capable of being subjected to the uniform mixing processing with agitation and are thus capable of being caused to react uniformly with each other. The mixing processing with agitation is continued for a certain period of time after the addition of the alkaline solution and the addition of the water-soluble bismuth compound solution have been finished. Thereafter, a dispersed reaction product having thus been obtained is subjected to filtration under reduced pressure or centrifugal separation, and the liquid constituents are thereby removed from the reaction product. In this manner, the $Bi_{12}MO_{20}$ particles are capable of being obtained. Since the thus obtained $Bi_{12}MO_{20}$ particles contain by-products having been formed during the synthesis, the $Bi_{12}MO_{20}$ particles should preferably be purified with washing with water and washing with an alcohol.

As the technique for producing the photo-conductor layer by use of the $Bi_{12}MO_{20}$ particles having been obtained, it is possible to employ one of various known techniques, such as an aerosol deposition technique, a press sintering technique, a hot isostatic pressing technique (i.e., an HIP technique), a hot pressing technique, and a green sheet technique.

With the aerosol deposition technique, the $Bi_{12}MO_{20}$ particles are caused to fly by a carrier gas in a vacuum, and the carrier gas containing the $Bi_{12}MO_{20}$ particles is blown against a substrate in a vacuum. In this manner, the $Bi_{12}MO_{20}$ particles are deposited on the substrate. With the press sintering technique, the $Bi_{12}MO_{20}$ particles are molded into a film form at a high pressure by use of a uniaxial pressing machine or a cold isostatic pressing machine, and the thus formed film is subjected to sintering processing.

With the HIP technique, a high temperature of several hundreds of degrees centigrade and an isostatic pressure falling within the range of several tens of MPa to several hundreds of MPa are simultaneously exerted upon the $Bi_{12}MO_{20}$ particles. With the hot pressing technique, pressing at a high temperature of several hundreds of degrees centigrade and with a pressure from only a uniaxial direction is performed on the $Bi_{12}MO_{20}$ particles.

With the green sheet technique, the $Bi_{12}MO_{20}$ particles are mixed with a binder, and the thus obtained coating composition is subjected to coating processing, a green sheet (i.e., a film containing the binder) being thereby formed. Also, the thus formed green sheet is subjected to firing processing for removing the binder from the film and sintering the $Bi_{12}MO_{20}$ particles.

Preferable examples of the binders, which may be utilized for the green sheet technique described above, include nitrocellulose, hydroxypropylcellulose, ethylcellulose, cellulose acetate, a vinylidene chloride-vinyl chloride copolymer, a polyalkyl methacrylate, a polyurethane, a polyvinyl butyral, a polyester, a polystyrene, a polyamide, a polyethylene, a polyvinyl chloride, a polyvinyl acetate, a vinyl chloride-vinyl acetate copolymer, a polyvinyl alcohol, and a linear polyester.

With the process for producing $Bi_{12}MO_{20}$ particles in accordance with the present invention, the $Bi_{12}MO_{20}$ particles, in which M represents an element selected from the group consisting of Si and Ge, are obtained with the process comprising the steps of: (i) preparing the alkaline solution of the alkali-soluble compound, which is selected from the group consisting of the alkali-soluble silicon compound and the alkali-soluble germanium compound, (ii) preparing the water-soluble bismuth compound solution, and (iii) subjecting the alkaline solution and the water-soluble bismuth compound solution to the mixing processing with agitation at a temperature of at least 80° C. by use of the shearing type agitator, whereby the alkaline solution and the water-soluble bismuth compound solution are allowed to react with each other. Therefore, it is possible to obtain the $Bi_{12}MO_{20}$ particles having an average particle diameter ranging from 0.5 μm to 2 μm. With the process for producing $Bi_{12}MO_{20}$ particles in accordance with the present invention, it is thus possible to obtain the $Bi_{12}MO_{20}$ particles having particle sizes markedly smaller than the particles sizes of the particles obtained with the conventional liquid phase technique. Also, with the process for producing $Bi_{12}MO_{20}$ particles in accordance with the present invention, there is no risk of the problems occurring in that impurities originating from the vessels utilized for the grinding and mixing steps mix into the particles during the grinding and mixing steps as in the cases of the solid phase technique. Accordingly, the $Bi_{12}MO_{20}$ particles having uniform composition are capable of being obtained.

The photo-conductor layer for constituting a radiation imaging panel in accordance with the present invention is constituted of the $Bi_{12}MO_{20}$ particles having the small particle diameters, the high purity, and the uniform composition. Therefore, with the photo-conductor layer in accordance with the present invention, the effect of collecting the formed electric charges is capable of being enhanced, and electric noise is capable of being suppressed. As a result, the graininess characteristics of the obtained image are capable of being enhanced, and the sensitivity of the photo-conductor layer is capable of being enhanced.

Radiation imaging panels, each of which is provided with the photo-conductor layer produced by use of the $Bi_{12}MO_{20}$ particles having been obtained with the process for producing $Bi_{12}MO_{20}$ particles in accordance with the present invention, will be described hereinbelow.

Ordinarily, radiation imaging panels may be classified into a direct conversion type, in which the radiation energy is directly converted into electric charges, and the thus formed electric charges are accumulated, and an indirect conversion type, in which the radiation energy is converted into light by use of a scintillator, such as CsI, the thus obtained light is then converted into electric charges by use of a-Si photodiodes, and the thus formed electric charges are accumulated. The photo-conductor layer, which is produced by use of the $Bi_{12}MO_{20}$ particles having been produced with the process for producing $Bi_{12}MO_{20}$ particles in accordance with the present invention, is capable of being employed for the direct conversion type of the radiation imaging panel. The photo-conductor layer, which is produced by use of the $Bi_{12}MO_{20}$ particles having been produced with the process for producing $Bi_{12}MO_{20}$ particles in accordance with the present invention, may be employed for the radiation, such as X-rays, γ-rays, and α-rays.

The photo-conductor layer, which is produced by use of the $Bi_{12}MO_{20}$ particles having been produced with the process for producing $Bi_{12}MO_{20}$ particles in accordance with the present invention, may be employed for an optical read-out technique, in which the read-out operation is performed by use of a radiation image detector utilizing a semiconductor material capable of generating the electric charges when being exposed to light. The photo-conductor layer, which is produced by use of the $Bi_{12}MO_{20}$ particles having been produced with the process for producing $Bi_{12}MO_{20}$ particles in accordance with the present invention, may also be employed for a TFT technique. With the TFT technique, the electric charges having been generated with the irradiation of the radiation are accumulated, and the accumulated electric charges are read through an operation, in which an electric switch, such as a thin film transistor (TFT), is turned on and off with respect to each of pixels.

Firstly, by way of example, the radiation imaging panel employed for the optical read-out technique will be described hereinbelow.

FIG. 2 is a sectional view showing an example of a radiation imaging panel provided with a photo-conductor layer, which is produced by use of the $Bi_{12}MO_{20}$ particles having been produced with the process for producing $Bi_{12}MO_{20}$ particles in accordance with the present invention.

With reference to FIG. 2, a radiation imaging panel 20 comprises a first electrically conductive layer 21, which has transmissivity to recording radiation L1 described later. The radiation imaging panel 20 also comprises a recording radio-conductive layer 22, which exhibits electrical conductivity when it is exposed to the radiation L1 having passed through the first electrically conductive layer 21. The radiation imaging panel 20 further comprises a charge transporting layer 23, which acts approximately as an insulator with respect to electric charges (latent image polarity charges, e.g. negative charges) having a polarity identical with the polarity of electric charges occurring in the first electrically conductive layer 21, and which acts approximately as a conductor with respect to electric charges (transported polarity charges, positive charges in this example) having a polarity opposite to the polarity of the electric charges occurring in the first electrically conductive layer 21. The radiation imaging panel 20 still further comprises a reading photo-conductor layer 24, which exhibits electrical conductivity when it is exposed to reading light L2 described later, and a second electrically conductive layer 25 having transmissivity to the reading light L2. The first electrically conductive layer 21, the recording radio-conductive layer 22, the charge transporting layer 23, the reading photo-conductor layer 24, and the second electrically conductive layer 25 are overlaid in this order.

As each of the first electrically conductive layer 21 and the second electrically conductive layer 25, a film of an electrically conductive substance (tin dioxide film, or the like) uniformly coated on a transparent glass plate may be employed.

The charge transporting layer 23 may be constituted of one of various materials, which have the characteristics such that the difference between the mobility of the negative electric charges occurring in the first electrically conductive layer 21 and the mobility of the positive electric charges is large. The charge transporting layer 23 should preferably be constituted of, for example, an organic compound, such as a poly-N-vinylcarbazole (PVK), N,N'-diphenyl-N,N'-bis(3-methylphenyl)-[1,1'-biphenyl]-4,4'-diamine (TPD), or a disk-shaped liquid crystal; or a semiconductor substance, such as a polymer (polycarbonate, polystyrene, PVK) dispersion of TPD, or a-Se doped with 10 ppm to 200 ppm of Cl. In particular, the organic compound (PVK, TPD, or the disk-shaped liquid crystal) has light insensitivity and is therefore preferable. Also, since the permittivity is ordinarily low, the capacity of the charge transporting layer 23 and the capacity of the reading photo-conductor layer 24 become small, and the signal take-out efficiency at the time of readout is capable of being kept high.

The reading photo-conductor layer 24 should preferably be constituted of, for example, a photo-conductive material containing, as a principal constituent, at least one substance selected from the group consisting of a-Se, Se—Te, Se—As—Te, metal-free phthalocyanine, metallo-phthalocyanine, magnesium phthalocyanine (MgPc), phase II of vanadyl phthalocyanine (VoPc), and copper phthalocyanine (CuPc).

As the recording radio-conductive layer 22, the photo-conductor layer, which is produced by use of the $Bi_{12}MO_{20}$ particles having been produced with the process for producing $Bi_{12}MO_{20}$ particles in accordance with the present invention, is employed. Specifically, the photo-conductor layer, which is produced by use of the $Bi_{12}MO_{20}$ particles having been produced with the process for producing $Bi_{12}MO_{20}$ particles in accordance with the present invention, is the recording radio-conductive layer.

The optical read-out technique for reading out the electrostatic latent image will hereinbelow be described briefly.

FIG. 3 is a schematic view showing a recording and read-out system (i.e., a combination of an electrostatic latent image recording apparatus and an electrostatic latent image read-out apparatus), in which the radiation imaging panel 20 of FIG. 2 is employed. With reference to FIG. 3, the recording and read-out system comprises the radiation imaging panel 20 and recording irradiation means 90. The recording and read-out system also comprises an electric power source 50 and electric current detecting means 70. The recording and read-out system further comprises read-out exposure means 92, connection means S1, and connection means S2. The electrostatic latent image recording apparatus is constituted of the radiation imaging panel 20, the electric power source 50, the recording irradiation means 90, and the connection means S1. The electrostatic latent image read-out apparatus is constituted of the radiation imaging panel 20, the electric current detecting means 70, and the connection means S2.

The first electrically conductive layer 21 of the radiation imaging panel 20 is connected via the connection means S1 to a negative pole of the electric power source 50. The first electrically conductive layer 21 of the radiation imaging panel 20 is also connected to one end of the connection means S2. One terminal of the other end of the connection means S2 is connected to the electric current detecting means 70. The second electrically conductive layer 25 of the radiation imaging panel 20, a positive pole of the electric power source 50, and the other terminal of the other end of the connection means S2 are grounded. The electric current detecting means 70 comprises a detection amplifier 70a, which is constituted of an operational amplifier, and a feedback resistor 70b. The electric current detecting means 70 thus constitutes a current-to-voltage converting circuit.

An object 9 lies at the top surface of the first electrically conductive layer 21. The object 9 has a transmissive region 9a, which has the transmissivity to the radiation L1, and a light blocking region 9b, which does not have the transmissivity to the radiation L1. The recording irradiation means 90 uniformly irradiates the radiation L1 to the object 9. With the read-out exposure means 92, the reading light L2, such as an infrared laser beam, an LED light, or an EL light, is scanned in the direction indicated by the arrow in FIG. 3. The reading light L2 should preferably has a beam shape having been converged into a small beam diameter.

Figure 4A:
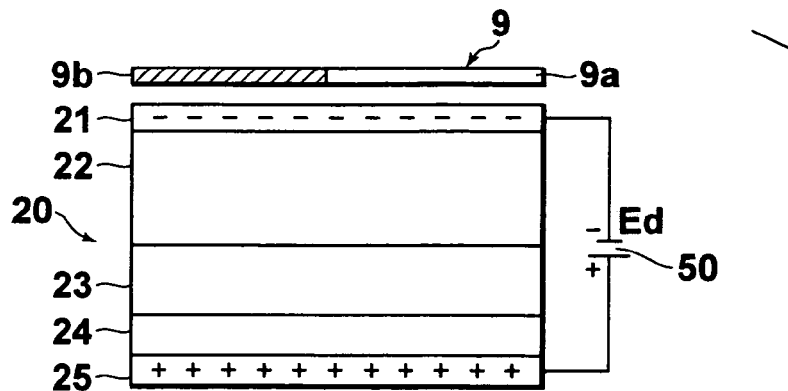
FIGS. 4A to 4D are explanatory views showing electric charge models for explanation of an electrostatic latent image recording stage in the recording and read-out system of FIG. 3, FIGS. 5A to 5D are explanatory views showing electric charge models for explanation of an electrostatic latent image read-out stage in the recording and read-out system of FIG. 3.

An electrostatic latent image recording stage in the recording and read-out system of FIG. 3 will be described hereinbelow with reference to FIGS. 4A to 4D. FIGS. 4A to 4D are explanatory views showing electric charge models for explanation of an electrostatic latent image recording stage in the recording and read-out system of FIG. 3. The connection means S2 illustrated in FIG. 3 is set in an open state (in which the connection means S2 is not connected to the ground nor to the electric current detecting means 70). Also, as illustrated in FIG. 4A, the connection means S1 illustrated in FIG. 3 is set in the on state, and a d.c. voltage Ed supplied by the electric power source 50 is applied between the first electrically conductive layer 21 and the second electrically conductive layer 25. As a result, the negative charges occur in the first electrically conductive layer 21, and the positive charges occur in the second electrically conductive layer 25. In this manner, a parallel electric field is formed between the first electrically conductive layer 21 and the second electrically conductive layer 25.

Figure 4B:
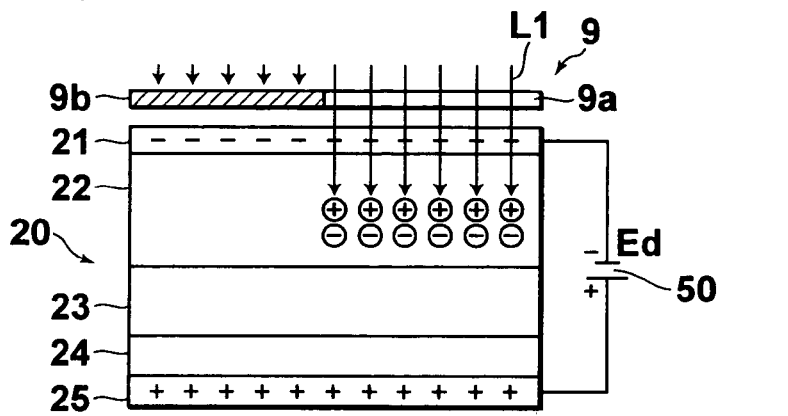

Thereafter, as illustrated in FIG. 4B, the radiation L1 is uniformly irradiated from the recording irradiation means 90 toward the object 9. The radiation L1, which has been produced by the recording irradiation means 90, passes through the transmissive region 9a of the object 9. The radiation L1 then passes through the first electrically conductive layer 21 and impinges upon the recording radio-conductive layer 22. When the recording radio-conductive layer 22 receives the radiation L1 having passed through the first electrically conductive layer 21, the recording radio-conductive layer 22 exhibits the electrical conductivity. The characteristics of the recording radio-conductive layer 22 for exhibiting the electrical conductivity are capable of being found from the characteristics in that the recording radio-conductive layer 22 acts as a variable resistor exhibiting a resistance value variable in accordance with the dose of the radiation L1. The resistance value depends upon the occurrence of electric charge pairs of electrons (negative charges) and holes (positive charges) due to the radiation L1. In cases where the dose of the radiation L1, which has passed through the object 9, is small, a large resistance value is exhibited. In FIG. 4B, the negative charges (−) formed by the radiation L1 are represented by "−" surrounded by the "○" mark, and the positive charges (+) formed by the radiation L1 are represented by "+" surrounded by the "○" mark.

Figure 4C:
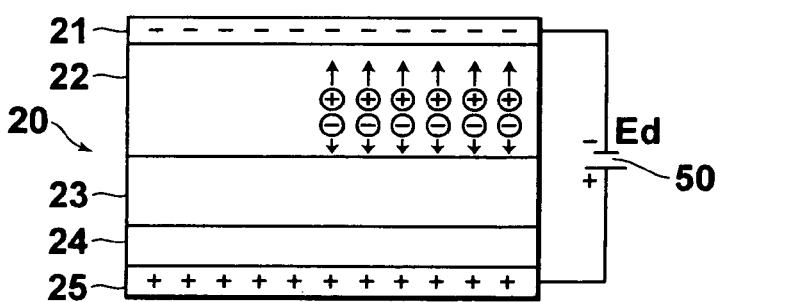
Figure 4D:
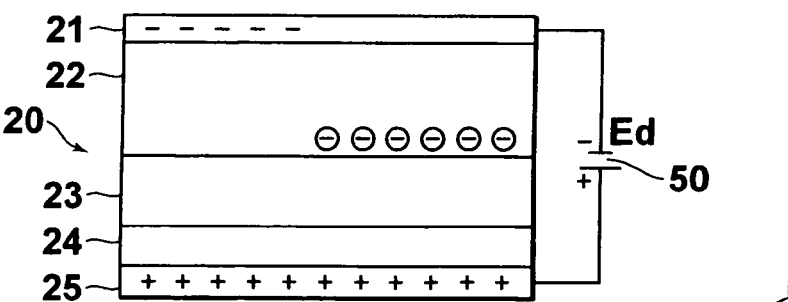

As illustrated in FIG. 4C, the positive charges, which have occurred in the recording radio-conductive layer 22, quickly migrate through the recording radio-conductive layer 22 toward the first electrically conductive layer 21. Also, as illustrated in FIG. 4D, the positive charges, which have migrated through the recording radio-conductive layer 22 toward the first electrically conductive layer 21, undergo charge re-combination with the negative charges, which have been formed in the first electrically conductive layer 21. The charge re-combination occurs at the interface between the first electrically conductive layer 21 and the recording radio-conductive layer 22, and the positive charges described above disappear.

Also, as illustrated in FIG. 4C, the negative charges, which have occurred in the recording radio-conductive layer 22, migrate through the recording radio-conductive layer 22 toward the charge transporting layer 23. The charge transporting layer 23 acts as the insulator with respect to the electric charges (in this example, the negative charges) having the polarity identical with the polarity of the electric charges occurring in the first electrically conductive layer 21. Therefore, as illustrated in FIG. 4D, the negative charges, which have migrated through the recording radio-conductive layer 22 toward the charge transporting layer 23, cease at the interface between the recording radio-conductive layer 22 and the charge transporting layer 23 and are accumulated at the interface between the recording radio-conductive layer 22 and the charge transporting layer 23. The quantity of the electric charges, which are thus accumulated, is defined by the quantity of the negative charges occurring in the recording radio-conductive layer 22, i.e. the dose of the radiation L1 having passed through the object 9.

The radiation L1 does not pass through the light blocking region 9b of the object 9. Therefore, as illustrated in FIGS. 4B, 4C, and 4D, a change does not occur at the region of the radiation imaging panel 20, which region is located under the light blocking region 9b of the object 9. In the manner described above, in cases where the radiation L1 is irradiated to the object 9, electric charges in accordance with the object image are capable of being accumulated at the interface between the recording radio-conductive layer 22 and the charge transporting layer 23. The object image, which is formed with the thus accumulated electric charges, is referred to as the electrostatic latent image.

Figure 5A:
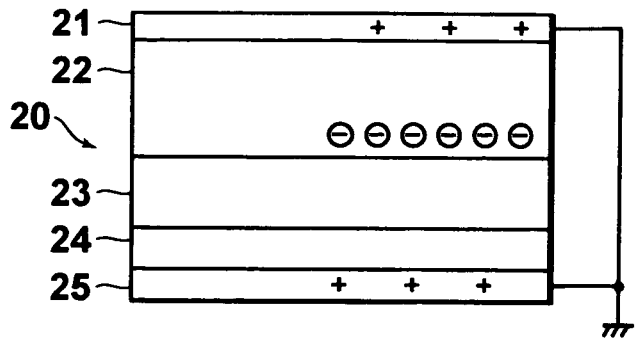

An electrostatic latent image read-out stage in the recording and read-out system of FIG. 3 will be described hereinbelow with reference to FIGS. 5A to 5D. FIGS. 5A to 5D are explanatory views showing electric charge models for explanation of an electrostatic latent image read-out stage in the recording and read-out system of FIG. 3. The connection means S1 illustrated in FIG. 3 is set in the open state, and the supply of the electric power is ceased. Also, as illustrated in FIG. 5A, the connection means S2 illustrated in FIG. 3 is connected to the ground side. In this manner, the first electrically conductive layer 21 and the second electrically conductive layer 25 of the radiation imaging panel 20, on which the electrostatic latent image has been recorded, are set at the identical electric potential, and re-arrangement of the electric charges is performed. Thereafter, the connection means S2 is connected to the side of the electric current detecting means 70.

Figure 5B:
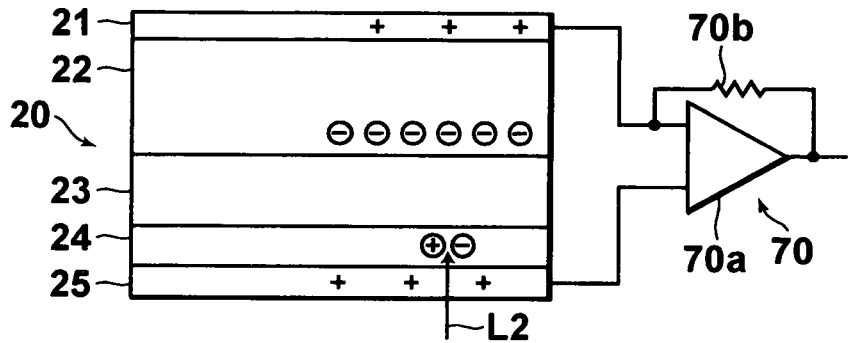

Also, as illustrated in FIG. 5B, with the read-out exposure means 92, the scanning with the reading light L2 is performed from the side of the second electrically conductive layer 25 of the radiation imaging panel 20. The reading light L2 impinging upon the second electrically conductive layer 25 passes through the second electrically conductive layer 25 and impinges upon the reading photo-conductor layer 24. When the reading photo-conductor layer 24 is exposed to the reading light L2, which has passed through the second electrically conductive layer 25, the reading photo-conductor layer 24 exhibits the electrical conductivity in accordance with the scanning exposure. As in the cases of the characteristics of the recording radio-conductive layer 22 for exhibiting the electrical conductivity due to the occurrence of the pairs of the positive and negative charges when the recording radio-conductive layer 22 is exposed to the radiation L1, the characteristics of the reading photo-conductor layer 24 for exhibiting the electrical conductivity depend upon the occurrence of the pairs of the positive and negative charges when the reading photo-conductor layer 24 is exposed to the reading light L2. As in the cases of the electrostatic latent image recording stage, in FIG. 5B, the negative charges (−) formed by the reading light L2 are represented by "−" surrounded by the "○" mark, and the positive charges (+) formed by the reading light L2 are represented by "+" surrounded by the "○" mark.

Figure 5C:
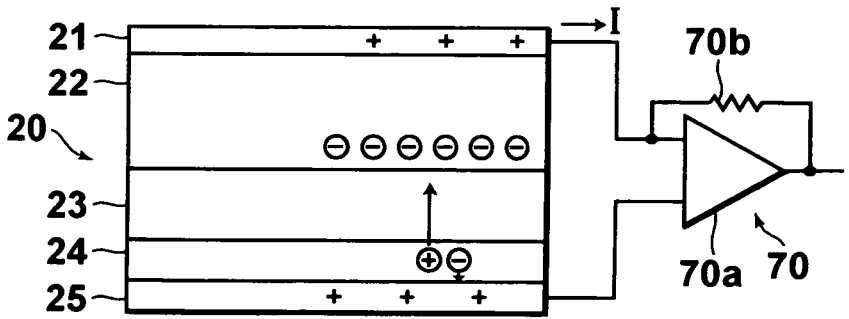
Figure 5D:
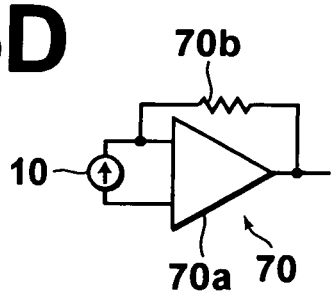

The charge transporting layer 23 acts as the electrical conductor with respect to the positive charges. Therefore, as illustrated in FIG. 5C, the positive charges, which have occurred in the reading photo-conductor layer 24, quickly migrate through the charge transporting layer 23 by being attracted by the negative charges, which have been accumulated at the interface between the recording radio-conductive layer 22 and the charge transporting layer 23. The positive charges, which have thus migrated through the charge transporting layer 23, undergo the charge re-combination with the accumulated negative charges at the interface between the recording radio-conductive layer 22 and the charge transporting layer 23 and disappear. Also, as illustrated in FIG. 5C, the negative charges, which have occurred in the reading photo-conductor layer 24, undergo the charge re-combination with the positive charges of the second electrically conductive layer 25 and disappear. The reading photo-conductor layer 24 is scanned with the reading light L2 having a sufficient optical intensity, and all of the accumulated electric charges, which have been accumulated at the interface between the recording radio-conductive layer 22 and the charge transporting layer 23, i.e. the electrostatic latent image, disappear through the charge re-combination. The disappearance of the electric charges, which have been accumulated in the radiation imaging panel 20, means the state, in which an electric current I flows across the radiation imaging panel 20 due to the migration of the electric charges. The state, in which the electric current I flows across the radiation imaging panel 20 due to the migration of the electric charges, is capable of being represented by an equivalent circuit illustrated in FIG. 5D, in which the radiation imaging panel 20 is represented by the electric current source 10 having the electric current quantity depending upon the quantity of the accumulated electric charges.

As described above, the scanning of the radiation imaging panel 20 with the reading light L2 is performed, and the electric current flowing across the radiation imaging panel 20 is detected. In this manner, the quantity of the accumulated electric charges, which have been accumulated at each of scanned regions (corresponding to pixels), is capable of being detected. The electrostatic latent image is thus capable of being read out. The operations of the radiation detecting section are described in, for example, Japanese Unexamined Patent Publication No. 2000-105297.

Figure 6:
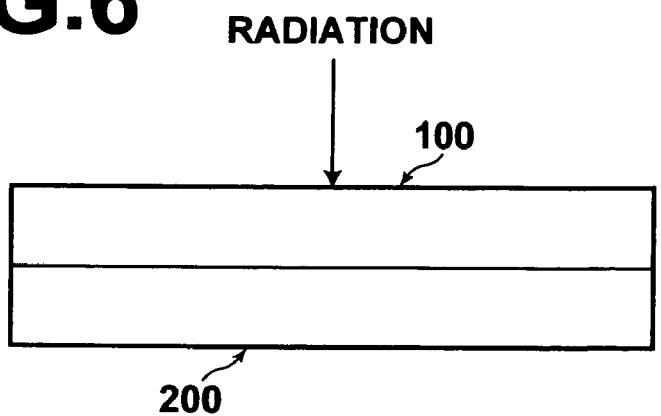
FIG. 6 is an explanatory view showing a radiation detector and an AMA board, which are combined together.
Figure 7:
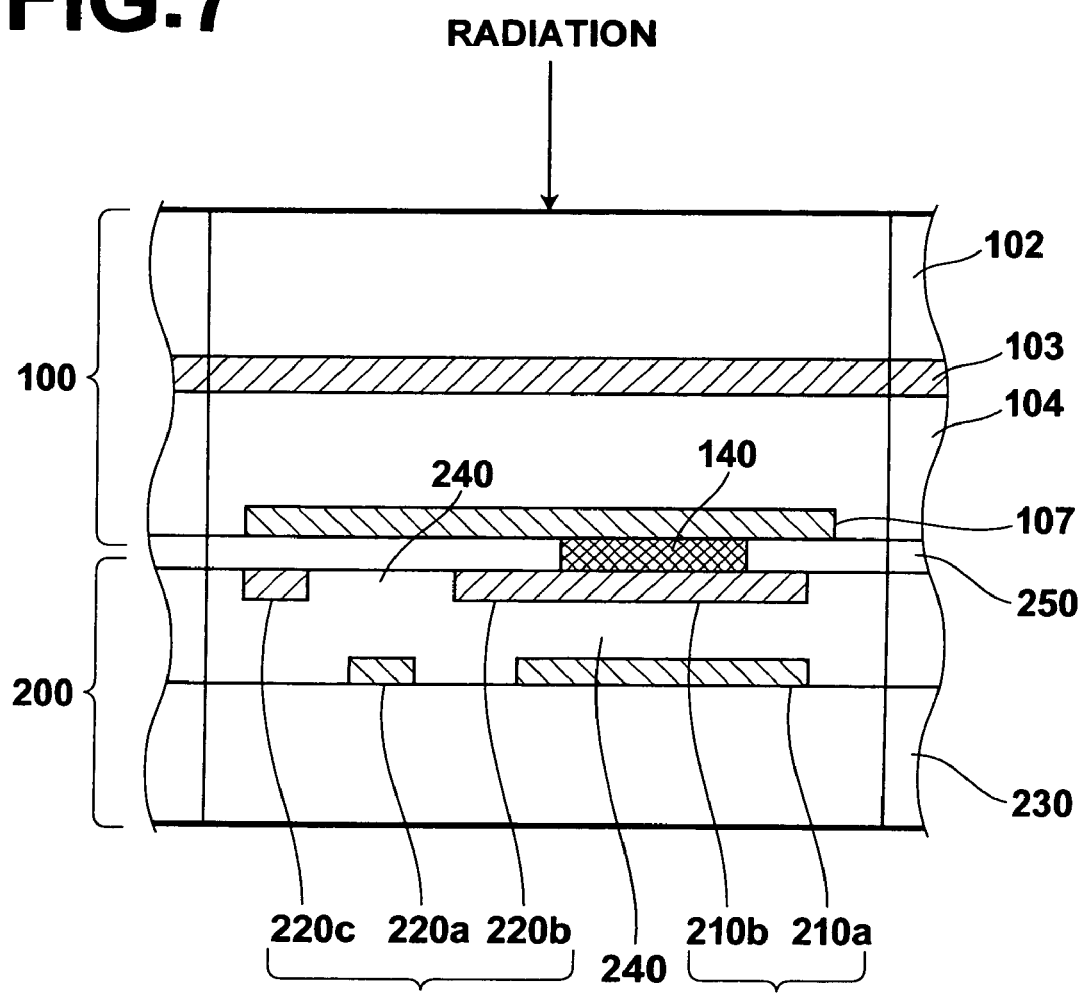
FIG. 7 is an electric circuit diagram showing an equivalent circuit of the AMA board.

The TFT type of the radiation imaging panel will be described hereinbelow. As illustrated in FIG. 6, the TFT type of the radiation imaging panel has a structure, in which a radiation detecting section 100 and an active matrix array board (AMA board) 200 has been joined together. As illustrated in FIG. 7, the radiation detecting section 100 comprises a common electrode 103 for application of a bias voltage. The radiation detecting section 100 also comprises a photo-conductor layer 104, which is sensitive to the radiation to be detected and forms carriers constituted of electron-hole pairs. The radiation detecting section 100 further comprises a detection electrode 107 for collecting the carriers. The common electrode 103, the photo-conductor layer 104, and the detection electrode 107 are overlaid in this order from the radiation incidence side. A radiation detecting section support 102 may be located as a top layer on the common electrode 103.

The photo-conductor layer 104 is the photo-conductor layer produced by use of the $Bi_{12}MO_{20}$ particles having been produced with the process for producing $Bi_{12}MO_{20}$ particles in accordance with the present invention. Each of the common electrode 103 and the detection electrode 107 may be constituted of an electrically conductive material, such as indium tin oxide (ITO), Au, or Pt. In accordance with the polarity of the bias voltage, a hole injection blocking layer or an electron injection blocking layer may be appended to the common electrode 103 or the detection electrode 107.

Figure 8:
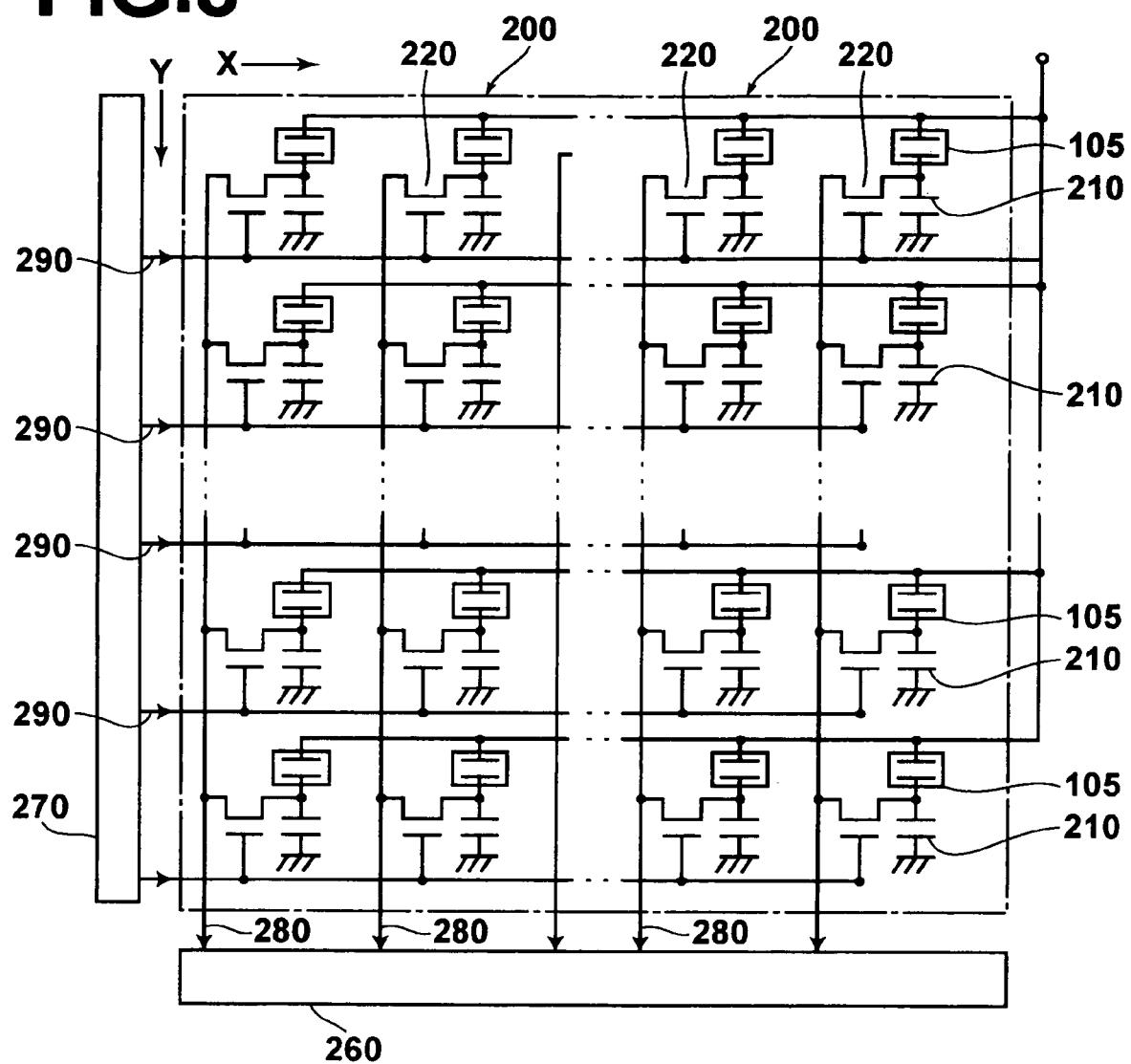
FIG. 8 is a sectional view showing a constitution at each of radiation detecting sections, each of which corresponds to one pixel.

The constitution of the AMA board 200 will hereinbelow be described briefly. As illustrated in FIG. 8, the AMA board 200 comprises capacitors 210, 210, . . . acting as charge accumulating capacitors and TFT's 220, 220, . . . acting as switching devices. One capacitor 210 and one TFT 220 are located for each of radiation detecting sections 105, 105, . . . , which correspond respectively to the pixels. On the radiation detecting section support 102, in accordance with the necessary pixels, the radiation detecting sections 105, 105, . . . , corresponding to the pixels are arrayed in two-dimensional directions in a pattern of a matrix comprising approximately 1,000~3,000 rows×1,000~3,000 columns. Also, the AMA board 200 comprises the same number of the combinations of the capacitor 210 and the TFT 220 as the number of the pixels are arrayed in two-dimensional directions in the same matrix patter as that described above. The electric charges, which have occurred in the photo-conductor layer 104, are accumulated in each of the capacitors 210, 210, . . . and act as the electrostatic latent image corresponding to the optical read-out technique. With the TFT technique, the electrostatic latent image having been formed with the radiation is kept at the charge accumulating capacitors.

The specific constitutions of each of the capacitors 210, 210, . . . and each of the TFT's 220, 220, . . . of the AMA board 200 are illustrated in FIG. 7. Specifically, an AMA board substrate 230 is constituted of an electrical insulator. A grounding side electrode 210a of the capacitor 210 and a gate electrode 220a of the TFT 220 are formed on the surface of the AMA board substrate 230. Above the grounding side electrode 210a of the capacitor 210 and the gate electrode 220a of the TFT 220, a connection side electrode 210b of the capacitor 210 is formed via an insulating film 240. Also, above the grounding side electrode 210a of the capacitor 210 and the gate electrode 220a of the TFT 220, a source electrode 220b and a drain electrode 220c of the TFT 220 are formed via the insulating film 240. Further, the top surface of the AMA board 200 is covered with a protective insulating film 250. The connection side electrode 210b of the capacitor 210 and the source electrode 220b of the TFT 220 are connected with each other and are formed together with each other. The insulating film 240 constitutes both the capacitor insulating film of the capacitor 210 and the gate insulating film of the TFT 220. The insulating film 240 may be constituted of, for example, a plasma SiN film. The AMA board 200 may be produced by use of a thin film forming technique or a fine processing technique, which is ordinarily employed for the production of a liquid crystal display board.

The joining of the radiation detecting section 100 and the AMA board 200 will be described hereinbelow. Specifically, the position of the detection electrode 107 and the position of the connection side electrode 210b of the capacitor 210 are matched with each other. In this state, the radiation detecting section 100 and the AMA board 200 are laminated together by adhesion under heating and under pressure with an anisotropic electrically conductive film (ACF) intervening therebetween. The ACF contains electrically conductive particles, such as silver particles, and has the electrical conductivity only in the thickness direction. In this manner, the radiation detecting section 100 and the AMA board 200 are mechanically combined with each other. At the same time, the detection electrode 107 and the connection side electrode 210b are electrically connected with each other by an intervening conductor section 140.

Also, the AMA board 200 is provided with a read-out actuating circuit 260 and a gate actuating circuit 270. As illustrated in FIG. 8, the read-out actuating circuit 260 is connected to each of read-out wiring lines (read-out address lines) 280, 280, . . . Each of the read-out wiring lines 280, 280, . . . extends in the vertical (Y) direction and connects the drain electrodes 220c, 220c, . . . of the TFT's 220, 220, . . . , which are arrayed along an identical column. The gate actuating circuit 270 is connected to each of read-out wiring lines (gate address lines) 290, 290, . . . Each of the read-out wiring lines 290, 290, . . . extends in the horizontal (X) direction and connects the gate electrodes 220a, 220a, . . . of the TFT's 220, 220, . . . , which are arrayed along an identical row. Though not shown, in the read-out actuating circuit 260, one pre-amplifier (one electric charge-to-voltage converter) is connected to each of the read-out wiring lines 280, 280, . . . In this manner, the AMA board 200 is connected to the read-out actuating circuit 260 and the gate actuating circuit 270. Alternatively, the read-out actuating circuit 260 and the gate actuating circuit 270 may be formed into an integral body within the AMA board 200.

The radiation detecting operations performed by the radiation image recording and read-out system, which comprises the radiation detecting section 100 and the AMA board 200 joined together, are described in, for example, Japanese Unexamined Patent Publication No. 11(1999)-287862.

The present invention will further be illustrated by the following non-limitative examples.

EXAMPLES

Example 1

Firstly, 482g of bismuth nitrate pentahydrate ($Bi(NO_3)_3 \cdot 5H_2O$, purity: 99.9%) was dissolved in 800 ml of a 1N aqueous nitric acid solution, and the resulting solution was made up to 1,000 ml by the addition of water. In this manner, an addition liquid "a" was prepared.

Also, 12.9 g of potassium metasilicate and 325 g of potassium hydroxide were dissolved in water, and the resulting solution was made up to 1,000 ml by the addition of water. In this manner, an addition liquid "b" was prepared.

Further, 7.7 g of potassium metasilicate and 281 g of potassium hydroxide were dissolved in water, and the resulting solution was made up to 5,000 ml by the addition of water. In this manner, a mother liquor P was prepared.

Thereafter, the mother liquor P was introduced into the reaction tank 2 of the production apparatus 1 provided with the shearing type agitator 8 as illustrated in FIG. 1. Also, the addition liquid "a" was introduced into the solution tank 4, and the addition liquid "b" was introduced into the solution tank 5. Further, the mother liquor P having been introduced into the reaction tank 2 was heated by the jacket 3, and the temperature of the mother liquor P was set at 90° C. Furthermore, the rotation speed of the motor 9 was set at 4,000 revolutions per minute, and the mother liquor P was agitated by the shearing type agitator 8. At this time, the circumferential speed of the agitating blade was equal to 3.5 m/sec. While the state described above was being kept, the addition liquid "a" was added from the solution tank 4 into the reaction tank 2 at a feed rate of 20 ml per minute, and the addition liquid "b" was added from the solution tank 5 into the reaction tank 2 at a feed rate of 20 ml per minute. After the addition of the addition liquid "a" and the addition of the addition liquid "b" were finished, the agitation was continued for a further period of time of 30 minutes. Thereafter, the reaction mixture was allowed to cool down to normal temperatures, and a pale yellow dispersed reaction product having been formed was collected by filtration. The reaction product having thus been collected by filtration was then washed three times with a 0.1N potassium hydroxide solution and was thereafter washed several times with water. The reaction product was then washed with ethanol. In this manner, $Bi_{12}SiO_{20}$ particles were obtained.

The thus obtained particles were dissolved in lithium tetraborate, and the resulting solution was subjected to a composition analysis with an induction coupling plasma (ICP) emission analysis technique. The composition analysis revealed that the Bi/Si atomic ratio was equal to 12.01. Also, a measurement with a powder X-ray diffraction technique revealed that the crystal structure of the obtained particles was the $Bi_{12}SiO_{20}$ crystal structure to be obtained. Further, with an analysis of the powder particles made by use of a scanning type electron microscope, it was confirmed that the particles were cubic particles. Furthermore, with a measurement made by use of a laser diffraction type of particle size distribution measuring apparatus, it was confirmed that the average particle diameter of the obtained particles was equal to 1 μm.

Example 2

Firstly, 232 g of bismuth oxide (purity: 99.9999%) was added to a 6N hydrochloric acid solution. The resulting mixture was heated to a temperature of 60° C., and bismuth oxide was dissolved in the 6N hydrochloric acid solution with agitation at a temperature of 60° C. for one hour. Water was then added to the resulting solution, and 1,000 ml of a hydrochloric acid solution of bismuth trichloride having a 1 molar concentration was thereby prepared. In this manner, an addition liquid "c" was prepared.

Also, an aqueous solution containing 577 g of tetramethylammonium hydroxide was agitated. While the aqueous solution containing tetramethylammonium hydroxide was being agitated, a 50% ethanol solution containing 17.4 g of tetraethoxysilane (purity: 99.9999%) was added slowly to the aqueous solution containing tetramethylammonium hydroxide. The resulting mixture was agitated at a temperature of 60° C. for one hour and was then made up to 1,000 ml by the addition of water. In this manner, an addition liquid "d" was prepared.

Further, an aqueous solution containing 474 g of tetramethylammonium hydroxide was agitated. While the aqueous solution containing tetramethylammonium hydroxide was being agitated, a 50% ethanol solution containing 10.4 g of tetraethoxysilane (purity: 99.9999%) was added slowly to the aqueous solution containing tetramethylammonium hydroxide. The resulting mixture was agitated at a temperature of 60° C. for one hour and was then made up to 5,000 ml by the addition of water. In this manner, a mother liquor Q was prepared.

Thereafter, the mother liquor Q was introduced into the reaction tank 2 of the production apparatus 1 provided with the shearing type agitator 8 as illustrated in FIG. 1. Also, the addition liquid "c" was introduced into the solution tank 4, and the addition liquid "d" was introduced into the solution tank 5. Further, the addition liquid "c" and the addition liquid "d" were allowed to react with each other under the conditions identical with the conditions in Example 1. Furthermore, a reaction product having been formed was processed in the same manner as that in Example 1, and $Bi_{12}SiO_{20}$ particles were thereby obtained.

The thus obtained particles were subjected to the composition analysis with the ICP emission analysis technique in the same manner as that in Example 1. The composition analysis revealed that the Bi/Si atomic ratio was equal to 12.06. Also, a measurement with the powder X-ray diffraction technique revealed that the crystal structure of the obtained particles was the $Bi_{12}SiO_{20}$ crystal structure to be obtained. Further, with an analysis of the powder particles made by use of the scanning type electron microscope, it was confirmed that the particles were cubic particles. Furthermore, with a measurement made by use of the laser diffraction type of particle size distribution measuring apparatus, it was confirmed that the average particle diameter of the obtained particles was equal to 0.8 μm.

Example 3

An aqueous solution containing 413 g of tetramethylammonium hydroxide was agitated. While the aqueous solution containing tetramethylammonium hydroxide was being agitated, a 50% ethanol solution containing 17.4 g of tetraethoxysilane (purity: 99.9999%) was added slowly to the aqueous solution containing tetramethylammonium hydroxide. The resulting mixture was agitated at a temperature of 60° C. for one hour and was then made up to 1,000 ml by the addition of water. In this manner, an addition liquid "e" was prepared.

Also, an aqueous solution containing 47 g of tetramethylammonium hydroxide was agitated. While the aqueous solution containing tetramethylammonium hydroxide was being agitated, a 50% ethanol solution containing 1.0 g of tetraethoxysilane (purity: 99.9999%) was added slowly to the aqueous solution containing tetramethylammonium hydroxide. The resulting mixture was agitated at a temperature of 60° C. for one hour and was then made up to 5,000 ml by the addition of water. In this manner, a mother liquor R was prepared.

Thereafter, the mother liquor R was introduced into the reaction tank 2 of the production apparatus 1 provided with the shearing type agitator 8 as illustrated in FIG. 1. Also, the addition liquid "c," which was prepared in the same manner as that for the addition liquid "c" in Example 2, was introduced into the solution tank 4, and the addition liquid "e" was introduced into the solution tank 5. Further, the addition liquid "c" and the addition liquid "e" were allowed to react with each other under the conditions identical with the conditions in Example 1. Furthermore, a reaction product having been formed was processed in the same manner as that in Example 1, and $Bi_{12}SiO_{20}$ particles were thereby obtained.

The thus obtained particles were subjected to the composition analysis with the ICP emission analysis technique in the same manner as that in Example 1. The composition analysis revealed that the Bi/Si atomic ratio was equal to 12.04. Also, a measurement with the powder X-ray diffraction technique revealed that the crystal structure of the obtained particles was the $Bi_{12}SiO_{20}$ crystal structure to be obtained. Further, with an analysis of the powder particles made by use of the scanning type electron microscope, it was confirmed that the particles were cubic particles. Furthermore, with a measurement made by use of the laser diffraction type of particle size distribution measuring apparatus, it was confirmed that the average particle diameter of the obtained particles was equal to 0.7 μm.

Example 4

An aqueous solution containing 413 g of tetramethylammonium hydroxide was agitated. While the aqueous solution containing tetramethylammonium hydroxide was being agitated, 8.724 g of germanium oxide (purity: 99.99%) was added to the aqueous solution containing tetramethylammonium hydroxide. The resulting mixture was agitated at a temperature of 60° C. for one hour and was then made up to 1,000 ml by the addition of water. In this manner, an addition liquid "f" was prepared.

Also, an aqueous solution containing 47 g of tetramethylammonium hydroxide was agitated. While the aqueous solution containing tetramethylammonium hydroxide was being agitated, 0.52 g of germanium oxide (purity: 99.99%) was added to the aqueous solution containing tetramethylammonium hydroxide. The resulting mixture was agitated at a temperature of 60° C. for one hour and was then made up to 5,000 ml by the addition of water. In this manner, a mother liquor S was prepared.

Thereafter, the mother liquor S was introduced into the reaction tank 2 of the production apparatus 1 provided with the shearing type agitator 8 as illustrated in FIG. 1. Also, the addition liquid "c," which was prepared in the same manner as that for the addition liquid "c" in Example 2, was introduced into the solution tank 4, and the addition liquid "f" was introduced into the solution tank 5. Further, the addition liquid "c" and the addition liquid "f" were allowed to react with each other under the conditions identical with the conditions in Example 1. Furthermore, a reaction product having been formed was processed in the same manner as that in Example 1, and $Bi_{12}GeO_{20}$ particles were thereby obtained.

The thus obtained particles were subjected to the composition analysis with the ICP emission analysis technique in the same manner as that in Example 1. The composition analysis revealed that the Bi/Ge atomic ratio was equal to 12.06. Also, a measurement with the powder X-ray diffraction technique revealed that the crystal structure of the obtained particles was the $Bi_{12}GeO_{20}$ crystal structure to be obtained. Further, with an analysis of the powder particles made by use of the scanning type electron microscope, it was confirmed that the particles were cubic particles. Furthermore, with a measurement made by use of the laser diffraction type of particle size distribution measuring apparatus, it was confirmed that the average particle diameter of the obtained particles was equal to 0.9 μm.

Comparative Example 1

Particles were produced by use of the technique described in, for example, the paper by H. S. Horowitz et al., "Solution Synthesis and Characterization of Sillenite Phases, $Bi_{24}M_2O_{40}$ (M=Si, Ge, V, As, P)", Solid State Ionics, 32/33, pp. 678-690, 1989. Specifically, the addition liquid "a," which was prepared in the same manner as that for the addition liquid "a" in Example 1, and the addition liquid "b," which was prepared in the same manner as that for the addition liquid "b" in Example 1, were added to the mother liquor P at normal temperatures, which mother liquor P was prepared in the same manner as that for the mother liquor P in Example 1. As a result, as described in the paper described above, precipitation occurred immediately in the reaction mixture. After the pH value of the reaction mixture had been adjusted to be 14, the reaction mixture was heated to a temperature of 75° C. and agitated for two days. In the same manner as that in Example 1, the dispersed reaction product having thus been obtained was collected by filtration and washed. In this manner, the particles were obtained.

The thus obtained particles were subjected to the composition analysis with the ICP emission analysis technique in the same manner as that in Example 1. The composition analysis revealed that the Bi/Si atomic ratio was equal to 11.20. Also, a measurement with the powder X-ray diffraction technique revealed that the crystal structure of the obtained particles was the $Bi_{12}SiO_{20}$ crystal structure to be obtained. Further, with an analysis of the powder particles made by use of the scanning type electron microscope, it was confirmed that the particles were cubic particles having particle sizes of approximately 10 μm. Furthermore, with a measurement made by use of the laser diffraction type of particle size distribution measuring apparatus, it was confirmed that the average particle diameter of the obtained particles was equal to 9 μm.

Comparative Example 2

Firstly, 279.6 g of $Bi_2O_3$ particles (purity: 99.9999%) and 6.00 g of $SiO_2$ particles ((purity: 99.9999%) were dispersed in 200 ml of ethanol. The resulting dispersion was then subjected to mixing and grinding processing by use of an alumina ball mill. After ethanol had been removed by evaporation, the obtained reaction product was put into an alumina crucible and subjected to preliminary firing at a temperature of 800° C. for eight hours. The product having been obtained from the preliminary firing was ground by use of an alumina mortar and was then ground by use of an alumina ball mill. In this manner, $Bi_{12}SiO_{20}$ particles were obtained.

The thus obtained particles were subjected to the composition analysis with the ICP emission analysis technique in the same manner as that in Example 1. The composition analysis revealed that the Bi/Si atomic ratio was equal to 12.01. Also, a measurement with the powder X-ray diffraction technique revealed that the crystal structure of the obtained particles was the $Bi_{12}SiO_{20}$ crystal structure to be obtained. Further, with an analysis of the powder particles made by use of the scanning type electron microscope, it was confirmed that the particles contained particles ranging from particles having particle sizes smaller than 1 μm to fragments having sizes of as large as 10 μm. Furthermore, with a measurement made by use of the laser diffraction type of particle size distribution measuring apparatus, it was confirmed that the obtained particles had a broad particle diameter distribution ranging from a particle diameter smaller than 1 μm to a particle diameter of as large as 5 μm.

(Production of Photo-conductor Layer)

A photo-conductor layer was produced in the manner described below by use of each of the $Bi_{12}SiO_{20}$ particles, which had been obtained in Examples 1, 2, and 3, the $Bi_{12}GeO_{20}$ particles, which had been obtained in Example 4, and the $Bi_{12}SiO_{20}$ particles, which had been obtained in Comparative Examples 1 and 2. Specifically, the 50 ml of ethanol was added to 50g of the particles, and 0.4% of polyvinyl butyral acting as a binder was added to the resulting mixture. The mixture having thus been obtained was subjected to rough dispersing processing. Thereafter, 3.7% of polyvinyl butyral and 0.8% by weight of dioctyl phthalate were added to the mixture, and the resulting mixture was subjected to intimate mixing and dispersing processing by use of a rotating mixer. A slurry was thus obtained. The thus obtained slurry was applied onto a film base, which had been coated with a releasing agent, by use of a coater, and a green sheet was thereby prepared. After the molded material had been dried at room temperature for 24 hours, the molded material was set on a sapphire setter having a high flatness. Also, the temperature of the molded material was raised gradually to 450° C. over a period of 10 hours under air atmosphere, and the binder was thus removed from the molded material. The molded material was then subjected to sintering processing at a temperature of 840° C. for two hours under argon gas flow in a gas substitution type muffle furnace. In this manner, a photo-conductor layer having a thickness of 500 μm was obtained.

(Evaluation Method and Results of Evaluation)

With respect to each of the photo-conductor layers having been obtained in the manner described above, an evaluation was made in the manner described below. Specifically, gold was deposited with a vacuum evaporation technique to a thickness of 600 nm on each of the opposite surfaces of the photo-conductor layer. Also, a voltage of 1 kV was applied across the thus formed gold electrodes. Further, in this state, X-rays having been produced by a medical X-ray source were irradiated to the photo-conductor layer with a dose rate of 1 mrem for a period of 0.1 second. A quantity of electric charges generated per unit dose was measured from an X-ray photo-current having thus been formed. The results shown in Table 1 below were obtained. In Table 1, the particle diameter of the $Bi_{12}MO_{20}$ particles, the Bi/M atomic ratio, and the density of the photo-conductor layer are also shown. Also, in Table 1, the generated electric charge quantity was represented as a relative value with the quantity of the electric charges generated in the photo-conductor layer, which had been produced by use of the particles obtained in Comparative Example 2, being taken as 1. The density of the photo-conductor layer was measured with the Archimedean technique.

TABLE 1

| | Particle diameter of $Bi_{12}MO_{20}$ (μm) | Bi/M ratio | Density | Generated electric charge quantity (relative value) |
|---|---|---|---|---|
| Example 1 | 1 | 12.01 | 9.01 | 1.8 |
| Example 2 | 0.8 | 12.06 | 9.00 | 1.75 |
| Example 3 | 0.7 | 12.04 | 9.03 | 1.7 |
| Example 4 | 0.9 | 12.06 | 9.02 | 1.92 |
| Comp. Ex. 1 | 10 | 11.20 | 8.51 | Not measurable |
| Comp. Ex. 2 | 0.1 to 5 | 12.01 | 9.00 | 1.0 |

As clear from the Bi/M atomic ratios and the particle diameters shown in Table 1, each of the $Bi_{12}SiO_{20}$ particles, which had been obtained in Examples 1, 2, and 3, and the $Bi_{12}GeO_{20}$ particles, which had been obtained in Example 4, had a smaller particle diameter and had a crystal structure with more uniform composition and more uniform particle size than those of the $Bi_{12}SiO_{20}$ particles, which had been obtained in Comparative Examples 1 and 2. Also, the photo-conductor layer having been produced by use of each of the $Bi_{12}SiO_{20}$ particles, which had been obtained in Examples 1, 2, and 3 and had the small particle size, and the $Bi_{12}GeO_{20}$ particles, which had been obtained in Example 4 and had the small particle size, had the dense photo-conductor layer structure and exhibited the generated electric charge quantity, which was approximately two times as large as the generated electric charge quantity obtained with the photo-conductor layer having been produced by use of the $Bi_{12}SiO_{20}$ particles obtained with the conventional solid phase technique in Comparative Example 2. As for the photo-conductor layer having been produced by use of the $Bi_{12}SiO_{20}$ particles obtained in Comparative Example 1, cracks occurred with the photo-conductor layer during the stage of producing the photo-conductor layer due to the large particle diameter of the particles, and the generated electric charge quantity was not capable of being measured.

As described above, with the process for producing $Bi_{12}MO_{20}$ particles in accordance with the present invention, it is possible to obtain the $Bi_{12}MO_{20}$ particles having particle sizes markedly smaller than the particles sizes of the particles obtained with the conventional liquid phase technique. Also, with the process for producing $Bi_{12}MO_{20}$ particles in accordance with the present invention, there is no risk of the problems occurring in that impurities originating from the vessels utilized for the grinding and mixing steps mix into the particles during the grinding and mixing steps as in the cases of the solid phase technique. Accordingly, the $Bi_{12}MO_{20}$ particles having uniform composition are capable of being obtained.

Also, the photo-conductor layer for constituting a radiation imaging panel in accordance with the present invention is constituted of the $Bi_{12}MO_{20}$ particles described above. Therefore, with the photo-conductor layer in accordance with the present invention, the effect of collecting the formed electric charges is capable of being enhanced, and the sensitivity is capable of being kept high. Further, electric noise is capable of being suppressed. As a result, graininess characteristics of the obtained image are capable of being enhanced.

What is claimed is:

1. A process for producing $Bi_{12}MO_{20}$ particles, in which M represents an element selected from the group consisting of Si and Ge, the process comprising the steps of:
    i) preparing an alkaline solution of an alkali-soluble compound, which is selected from the group consisting of an alkali-soluble silicon compound and an alkali-soluble germanium compound,
    ii) preparing a water-soluble bismuth compound solution, and
    iii) subjecting the alkaline solution and the water-soluble bismuth compound solution to mixing processing with agitation at a temperature of at least 80° C. by use of a shearing agitator comprising a rotating blade and a stator,
    whereby the alkaline solution and the water-soluble bismuth compound solution are allowed to react with each other;
    wherein the mixing processing with agitation is performed while each of the alkaline solution and the water-soluble bismuth compound solution is being added at a certain feed rate to an alkaline mother liquor having been heated to a temperature of at least 80° C.

2. A process as defined in claim 1 wherein a circumferential speed of an agitating blade of the shearing agitator is at least 3 in/sec.

3. A process as defined in claim 1 wherein the alkaline mother liquor contains at least one kind of compound selected from the group consisting of LiOH, NaOH, KOH, RbOH, and $NR_4OH$, in which R represents an alkyl group selected from the group consisting of alkyl groups having one to three carbon atoms.

4. A process as defined in claim 3 wherein the water-soluble bismuth compound contained in the water-soluble bismuth compound solution is at least one kind of compound selected from the group consisting of bismuth nitrate, bismuth trichloride, and bismuth tribromide.

5. A process as defined in claim 3 wherein the alkali-soluble silicon compound is selected from the group consisting of an alkali metal silicate and a quaternary ammonium silicate.

6. A process as defined in claim 4 wherein the alkali-soluble silicon compound is selected from the group consisting of an alkali metal silicate and a quaternary ammonium silicate.

7. A process as defined in claim 3 wherein the alkali-soluble germanium compound is selected from the group consisting of an alkali metal germanate and a quaternary ammonium germanate.

8. A process as defined in claim 4 wherein the alkali-soluble germanium compound is selected from the group consisting of an alkali metal germanate and a quaternary ammonium germanate.

9. A photo-conductor layer for constituting a radiation imaging panel, which photo-conductor layer is capable of recording radiation image information as an electrostatic latent image,
    wherein the photo-conductor layer is produced by use of $Bi_{12}MO_{20}$ particles, which have been obtained with a process as defined in claim 1.

10. A photo-conductor layer for constituting a radiation imaging panel, which photo-conductor layer is capable of recording radiation image information as an electrostatic latent image,
    wherein the photo-conductor layer is produced by use of $Bi_{12}MO_{20}$ particles, which have been obtained with a process as defined in claim 2.

11. A photo-conductor layer for constituting a radiation imaging panel, which photo-conductor layer is capable of recording radiation image information as an electrostatic latent image,
    wherein the photo-conductor layer is produced by use of $Bi_{12}MO_{20}$ particles, which have been obtained with a process as defined in claim 3.

12. A photo-conductor layer for constituting a radiation imaging panel, which photo-conductor layer is capable of recording radiation image information as an electrostatic latent image,
    wherein the photo-conductor layer is produced by use of $Bi_{12}MO_{20}$ particles, which have been obtained with a process as defined in claim 4.

13. A photo-conductor layer for constituting a radiation imaging panel, which photo-conductor layer is capable of recording radiation image information as an electrostatic latent image,
    wherein the photo-conductor layer is produced by use of $Bi_{12}MO_{20}$ particles, which have been obtained with a process as defined in claim 5.

14. A photo-conductor layer for constituting a radiation imaging panel, which photo-conductor layer is capable of recording radiation image information as an electrostatic latent image,
    wherein the photo-conductor layer is produced by use of $Bi_{12}MO_{20}$ particles, which have been obtained with a process as defined in claim 6.

15. A photo-conductor layer for constituting a radiation imaging panel, which photo-conductor layer is capable of recording radiation image information as an electrostatic latent image,
    wherein the photo-conductor layer is produced by use of $Bi_{12}MO_{20}$ particles, which have been obtained with a process as defined in claim 7.

16. A photo-conductor layer for constituting a radiation imaging panel, which photo-conductor layer is capable of recording radiation image information as an electrostatic latent image,
    wherein the photo-conductor layer is produced by use of $Bi_{12}MO_{20}$ particles, which have been obtained with a process as defined in claim 8.

17. A process as defined in claim 1 wherein the temperature when the alkaline solution and the water-soluble bismuth compound solution are subjected to mixing processing with agitation is at least 90° C., and the temperature to which the alkaline mother liquor has been heated is at least 90° C.

* * * * *